(12) United States Patent
Endo et al.

(10) Patent No.: US 11,631,756 B2
(45) Date of Patent: Apr. 18, 2023

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Yuta Endo, Atsugi (JP); Toshinari Sasaki, Atsugi (JP); Kosei Noda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 187 days.

(21) Appl. No.: 17/073,520

(22) Filed: Oct. 19, 2020

(65) Prior Publication Data

US 2021/0126114 A1 Apr. 29, 2021

Related U.S. Application Data

(63) Continuation of application No. 16/209,023, filed on Dec. 4, 2018, now Pat. No. 10,811,522, which is a
(Continued)

(30) Foreign Application Priority Data

Nov. 11, 2010 (JP) .................................. 2010-252489

(51) Int. Cl.
*H01L 29/66* (2006.01)
*H01L 29/51* (2006.01)
(Continued)

(52) U.S. Cl.
CPC .. *H01L 29/66969* (2013.01); *H01L 21/02403* (2013.01); *H01L 21/425* (2013.01);
(Continued)

(58) Field of Classification Search
None
See application file for complete search history.

(56) References Cited

U.S. PATENT DOCUMENTS

| 5,581,092 A | 12/1996 | Takemura |
| 5,731,856 A | 3/1998 | Kim et al. |
| (Continued) | | |

FOREIGN PATENT DOCUMENTS

| CN | 101719514 A | 6/2010 |
| EP | 1737044 A | 12/2006 |
| (Continued) | | |

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.
(Continued)

*Primary Examiner* — Robert K Carpenter
(74) *Attorney, Agent, or Firm* — Robinson Intellectual Property Law Office; Eric J. Robinson

(57) ABSTRACT

A semiconductor device is manufactured using a transistor in which an oxide semiconductor is included in a channel region and variation in electric characteristics due to a short-channel effect is less likely to be caused. The semiconductor device includes an oxide semiconductor film having a pair of oxynitride semiconductor regions including nitrogen and an oxide semiconductor region sandwiched between the pair of oxynitride semiconductor regions, a gate insulating film, and a gate electrode provided over the oxide semiconductor region with the gate insulating film positioned therebetween. Here, the pair of oxynitride semiconductor regions serves as a source region and a drain region
(Continued)

of the transistor, and the oxide semiconductor region serves as the channel region of the transistor.

6 Claims, 10 Drawing Sheets

Related U.S. Application Data continuation of application No. 15/584,242, filed on May 2, 2017, now Pat. No. 10,153,360, which is a continuation of application No. 14/448,015, filed on Jul. 31, 2014, now Pat. No. 9,673,305, which is a continuation of application No. 13/289,436, filed on Nov. 4, 2011, now Pat. No. 8,802,515.

(51) Int. Cl.
*H01L 29/786* (2006.01)
*H01L 29/423* (2006.01)
*H01L 21/425* (2006.01)
*H01L 21/02* (2006.01)
*H01L 21/477* (2006.01)
*H01L 21/28* (2006.01)

(52) U.S. Cl.
CPC ...... *H01L 21/477* (2013.01); *H01L 29/42384* (2013.01); *H01L 29/518* (2013.01); *H01L 29/7869* (2013.01); *H01L 29/78618* (2013.01); *H01L 21/02* (2013.01); *H01L 21/02112* (2013.01); *H01L 21/28* (2013.01)

(56) References Cited

U.S. PATENT DOCUMENTS

| | | | |
|---|---|---|---|
| 5,744,864 A | 4/1998 | Cillessen et al. |
| 5,976,988 A | 11/1999 | Konuma et al. |
| 6,294,274 B1 | 9/2001 | Kawazoe et al. |
| 6,563,174 B2 | 5/2003 | Kawasaki et al. |
| 6,649,226 B2 | 11/2003 | Matsumoto |
| 6,706,573 B2 | 3/2004 | So |
| 6,727,522 B1 | 4/2004 | Kawasaki et al. |
| 6,727,877 B2 | 4/2004 | Itakura |
| 6,849,872 B1 | 2/2005 | Yamazaki et al. |
| 6,887,744 B2 | 5/2005 | Hotta |
| 7,015,507 B2 | 3/2006 | Yonehara et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,279,374 B2 | 10/2007 | So |
| 7,282,782 B2 | 10/2007 | Hoffman et al. |
| 7,288,444 B2 | 10/2007 | So |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,427,539 B2 | 9/2008 | So |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,470,579 B2 | 12/2008 | Lim et al. |
| 7,501,293 B2 | 3/2009 | Ito et al. |
| 7,575,959 B2 | 8/2009 | Tokunaga |
| 7,598,520 B2 | 10/2009 | Hirao et al. |
| 7,674,650 B2 | 3/2010 | Akimoto et al. |
| 7,692,223 B2 | 4/2010 | Isobe et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,804,091 B2 | 9/2010 | Takechi et al. |
| 7,838,346 B2 | 11/2010 | Tokunaga |
| 7,855,106 B2 | 12/2010 | Yamazaki et al. |
| 7,863,607 B2 | 1/2011 | Lee et al. |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 7,993,964 B2 | 8/2011 | Hirao et al. |
| 7,994,508 B2 | 8/2011 | Ye |
| 8,003,981 B2 | 8/2011 | Iwasaki et al. |
| 8,053,290 B2 | 11/2011 | Tokunaga |
| 8,143,115 B2 | 3/2012 | Omura et al. |
| 8,148,721 B2 | 4/2012 | Hayashi et al. |
| 8,154,024 B2 | 4/2012 | Iwasaki |
| 8,164,090 B2 | 4/2012 | Iwasaki et al. |
| 8,164,256 B2 | 4/2012 | Sano et al. |
| 8,178,884 B2 | 5/2012 | Ha et al. |
| 8,188,467 B2 | 5/2012 | Itagaki et al. |
| 8,193,535 B2 | 6/2012 | Ha et al. |
| 8,232,124 B2 | 7/2012 | Takechi et al. |
| 8,258,511 B2 | 9/2012 | Ye |
| 8,274,078 B2 | 9/2012 | Itagaki et al. |
| 8,338,238 B2 | 12/2012 | Tokunaga |
| 8,378,341 B2 | 2/2013 | Hayashi et al. |
| 8,384,076 B2 | 2/2013 | Park et al. |
| 8,445,902 B2 | 5/2013 | Sato et al. |
| 8,541,944 B2 | 9/2013 | Sano et al. |
| 8,728,862 B2 | 5/2014 | Ha et al. |
| 8,802,515 B2 | 8/2014 | Endo et al. |
| 8,896,049 B2 | 11/2014 | Isobe et al. |
| 8,936,963 B2 | 1/2015 | Ohara et al. |
| 9,129,937 B2 | 9/2015 | Hayashi et al. |
| 9,905,699 B2 | 2/2018 | Hayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252179 A1* | 11/2007 | Isobe ..................... H01L 27/12 257/E27.111 |
| 2007/0252928 A1 | 11/2007 | Ito et al. |
| 2007/0272922 A1 | 11/2007 | Kim et al. |
| 2007/0287296 A1 | 12/2007 | Chang |

(56) References Cited

U.S. PATENT DOCUMENTS

| | | |
|---|---|---|
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166475 A1 | 7/2008 | Jeong et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0051936 A1 | 3/2010 | Hayashi et al. |
| 2010/0065844 A1 | 3/2010 | Tokunaga |
| 2010/0084655 A1 | 4/2010 | Iwasaki et al. |
| 2010/0092800 A1 | 4/2010 | Itagaki et al. |
| 2010/0109002 A1 | 5/2010 | Itagaki et al. |
| 2010/0109058 A1 | 5/2010 | Sakata et al. |
| 2010/0117073 A1 | 5/2010 | Yamazaki et al. |
| 2010/0148171 A1 | 6/2010 | Hayashi et al. |
| 2010/0159639 A1 | 6/2010 | Sakata |
| 2010/0163868 A1 | 7/2010 | Yamazaki et al. |
| 2010/0187523 A1 | 7/2010 | Sakata et al. |
| 2010/0224878 A1 | 9/2010 | Kimura |
| 2010/0295042 A1 | 11/2010 | Yano et al. |
| 2011/0086472 A1 | 4/2011 | Yamazaki et al. |
| 2011/0182110 A1 | 7/2011 | Yamazaki et al. |
| 2011/0256684 A1 | 10/2011 | Iwasaki et al. |
| 2012/0112183 A1 | 5/2012 | Endo et al. |
| 2012/0168750 A1 | 7/2012 | Hayashi et al. |
| 2015/0287832 A1 | 10/2015 | Hayashi et al. |

FOREIGN PATENT DOCUMENTS

| | | |
|---|---|---|
| EP | 2120267 A | 11/2009 |
| EP | 2144294 A | 1/2010 |
| EP | 2175493 A | 4/2010 |
| EP | 2226847 A | 9/2010 |
| EP | 2339639 A | 6/2011 |
| EP | 2408011 A | 1/2012 |
| EP | 2816607 A | 12/2014 |
| EP | 2927965 A | 10/2015 |
| EP | 3249694 A | 11/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 10-111491 A | 4/1998 |
| JP | 11-505377 | 5/1999 |
| JP | 2000-044236 A | 2/2000 |
| JP | 2000-137248 A | 5/2000 |
| JP | 2000-150900 A | 5/2000 |
| JP | 2001-189459 A | 7/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-188385 A | 7/2003 |
| JP | 2003-241687 A | 8/2003 |
| JP | 2004-007004 A | 1/2004 |
| JP | 2004-103957 A | 4/2004 |
| JP | 2004-273614 A | 9/2004 |
| JP | 2004-273732 A | 9/2004 |
| JP | 2005-026712 A | 1/2005 |
| JP | 2006-165528 A | 6/2006 |
| JP | 2006-179874 A | 7/2006 |
| JP | 2007-096055 A | 4/2007 |
| JP | 2007-220816 A | 8/2007 |
| JP | 2007-220817 A | 8/2007 |
| JP | 2007-250983 A | 9/2007 |
| JP | 2007-318112 A | 12/2007 |
| JP | 2008-040343 A | 2/2008 |
| JP | 2008-300518 A | 12/2008 |
| JP | 2008-311616 A | 12/2008 |
| JP | 2009-272427 A | 11/2009 |
| JP | 2009-275236 A | 11/2009 |
| JP | 2009-278115 A | 11/2009 |
| JP | 2010-021520 A | 1/2010 |
| JP | 2010-093070 A | 4/2010 |
| JP | 2010-135774 A | 6/2010 |
| JP | 2010-141230 A | 6/2010 |
| JP | 2010-183108 A | 8/2010 |
| JP | 2010-232651 A | 10/2010 |
| JP | 2010-239131 A | 10/2010 |
| KR | 1999-0080890 A | 11/1999 |
| KR | 2001-0082830 A | 8/2001 |
| KR | 2001-0112640 A | 12/2001 |
| KR | 2002-0055990 A | 7/2002 |
| KR | 2002-0078119 A | 10/2002 |
| KR | 2004-0051074 A | 6/2004 |
| KR | 2004-0060239 A | 7/2004 |
| KR | 2006-0036005 A | 4/2006 |
| KR | 2007-0051090 A | 5/2007 |
| KR | 2008-0066678 A | 7/2008 |
| KR | 2008-0114802 A | 12/2008 |
| KR | 2009-0089444 A | 8/2009 |
| KR | 2009-0095612 A | 9/2009 |
| KR | 2010-0039806 A | 4/2010 |
| KR | 2010-0103414 A | 9/2010 |
| TW | 535021 | 6/2003 |
| WO | WO-2004/114391 | 12/2004 |
| WO | WO-2007/029844 | 3/2007 |
| WO | WO-2007/119386 | 10/2007 |
| WO | WO-2007/142167 | 12/2007 |
| WO | WO-2008/069056 | 6/2008 |
| WO | WO-2008/069255 | 6/2008 |
| WO | WO-2008/069286 | 6/2008 |
| WO | WO-2008/133345 | 11/2008 |
| WO | WO-2008/149754 | 12/2008 |
| WO | WO-2009/093625 | 7/2009 |
| WO | WO-2009/136645 | 11/2009 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3'In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 Inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 DIGEST, 2007, pp. 1249-1252.

Godo.H et al., "Temperature Dependence of Characteristicsand Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications",

(56) References Cited

OTHER PUBLICATIONS

SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
LEE.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Korean Office Action (Application No. 2011-0116944) dated Feb. 23, 2018.
Taiwanese Office Action (Application No. 106112396) dated Jun. 28, 2018.
Korean Office Action (Application No. 2011-0116944) dated Aug. 22, 2018.

\* cited by examiner

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

Note that in this specification, a semiconductor device refers to any device that can function by utilizing semiconductor characteristics, and an electro-optical device, a semiconductor circuit, and an electronic device are all semiconductor devices.

2. Description of the Related Art

A technique by which transistors are formed using semiconductor thin films formed over a substrate having an insulating surface has been attracting attention. Such transistors are applied to a wide range of electronic devices such as an integrated circuit (IC) or an image display device (display device). As materials for semiconductor thin films applicable to the transistors, silicon-based semiconductor materials have been widely used, but oxide semiconductors have been attracting attention as alternative materials.

For example, a transistor whose active layer is formed using an amorphous oxide including indium (In), gallium (Ga), and zinc (Zn) and having an electron carrier density lower than $10^{18}/cm^3$ is disclosed (see Patent Document 1).

Patent Document 2 discloses a technique in which in a staggered transistor including an oxide semiconductor, a highly conductive oxide semiconductor including nitrogen is provided as buffer layers between a source region and a source electrode and between a drain region and a drain electrode, and thereby the contact resistance between the oxide semiconductor and the source electrode and between the oxide semiconductor and the drain electrode is reduced.

Non-Patent Document 1 discloses a top-gate oxide semiconductor transistor in which a channel region, a source region, and a drain region are formed in a self-aligned process.

REFERENCE

Patent Document

[Patent Document 1] Japanese Published Patent Application No. 2006-165528
[Patent Document 2] Japanese Published Patent Application No. 2010-135774

Non-Patent Document

[Non-Patent Document 1] Jae Chul Park et al., "High performance amorphous oxide thin film transistors with self-aligned top-gate structure" IEDM2009, pp. 191-194

SUMMARY OF THE INVENTION

An object is to manufacture a semiconductor device using a transistor in which an oxide semiconductor is included in a channel region and variation in electric characteristics due to a short-channel effect is less likely to be caused.

A semiconductor device according to one embodiment of the present invention includes an oxide semiconductor film having a pair of oxynitride semiconductor regions including nitrogen and an oxide semiconductor region sandwiched between the pair of oxynitride semiconductor regions, a gate insulating film, and a gate electrode provided over the oxide semiconductor region with the gate insulating film positioned therebetween.

Here, the pair of oxynitride semiconductor regions serves as a source region and a drain region of a transistor, and the oxide semiconductor region serves as a channel region of the transistor.

In the top-gate transistor, the source region and the drain region can be formed by implanting ions including nitrogen into the oxide semiconductor film with the use of the gate electrode as a mask. The source region and the drain region are formed using the gate electrode as a mask, whereby the source region and the drain region do not overlap with the gate electrode and thus parasitic capacitance can be reduced.

Since the parasitic capacitance can be reduced, the transistor can operate at high speed.

Here, the nitrogen concentration of the oxynitride semiconductor regions is higher than or equal to 0.01 at. % and lower than or equal to 30 at. %. The carrier density of the oxynitride semiconductor regions can be increased by increasing the nitrogen concentration; however, when the nitrogen concentration is too high, transfer of carriers is inhibited and the conductivity is decreased.

Note that ions including hydrogen may be implanted into the oxide semiconductor film at the same time as the ions including nitrogen. By implanting hydrogen into the oxynitride semiconductor regions, the carrier density can be increased as compared to the case of implanting only nitrogen. That is, the conductivity can be increased even when the concentration of implanted nitrogen is reduced. The hydrogen concentration of the oxynitride semiconductor regions is higher than or equal to $1\times10^{19}$ atoms/cm$^3$ and lower than or equal to $1\times10^{22}$ atoms/cm$^3$. The carrier density can be increased by increasing the hydrogen concentration; however, when the hydrogen concentration is too high, transfer of carriers is inhibited and the conductivity is decreased.

At this time, it is preferable to prevent hydrogen from being implanted into the channel region through the source region and the drain region of the oxide semiconductor film. If hydrogen is implanted into the channel region of the oxide semiconductor film, a carrier path might be formed without application of gate voltage. That is, normally-on characteristics are exhibited. Specifically, the hydrogen concentration of the channel region is lower than or equal to $1\times10^{20}$ atoms/cm$^3$, preferably lower than or equal to $1\times10^{19}$ atoms/cm$^3$, further preferably lower than or equal to $1\times10^{18}$ atoms/cm$^3$.

The use of the oxynitride semiconductor regions as the source region and the drain region has an effect in that a band edge of the channel which is the oxide semiconductor region is hardly curved. On the other hand, in the case where the source region and the drain region are formed using a metal material, a curve of the band edge of the channel which is the oxide semiconductor region is not negligible, so that the effective channel length is decreased in some cases. This tendency becomes more remarkable as the channel length of a transistor is reduced.

Moreover, the oxynitride semiconductor regions have a property of occluding hydrogen more easily than the oxide semiconductor region. Therefore, hydrogen taken into from the outside and hydrogen diffusing from the inside are occluded by the oxynitride semiconductor regions serving as the source region and the drain region, whereby the hydrogen concentration of the oxide semiconductor region serving as the channel region can be reduced. That is, provision of the oxynitride semiconductor regions as the source region and the drain region can suppress deterioration of electric characteristics of the transistor due to hydrogen and a reduction in reliability.

In addition, when the oxynitride semiconductor regions occlude hydrogen, nitrogen and hydrogen are bonded to each other, part thereof serves as a donor, and the carrier density is increased; consequently, the conductivity can be increased.

Note that it is confirmed that nitrogen in the oxynitride semiconductor regions does not diffuse into the oxide semiconductor region, which is described later.

Further, formation of the oxynitride semiconductor regions as the source region and the drain region enables a reduction in the contact resistance between the source and drain regions and wirings; thus, the on-state current of the transistor can be increased.

According to one embodiment of the present invention, a highly reliable transistor which includes an oxide semiconductor and has favorable electric characteristics can be manufactured.

DETAILED DESCRIPTION OF THE INVENTION

Figure 1A:
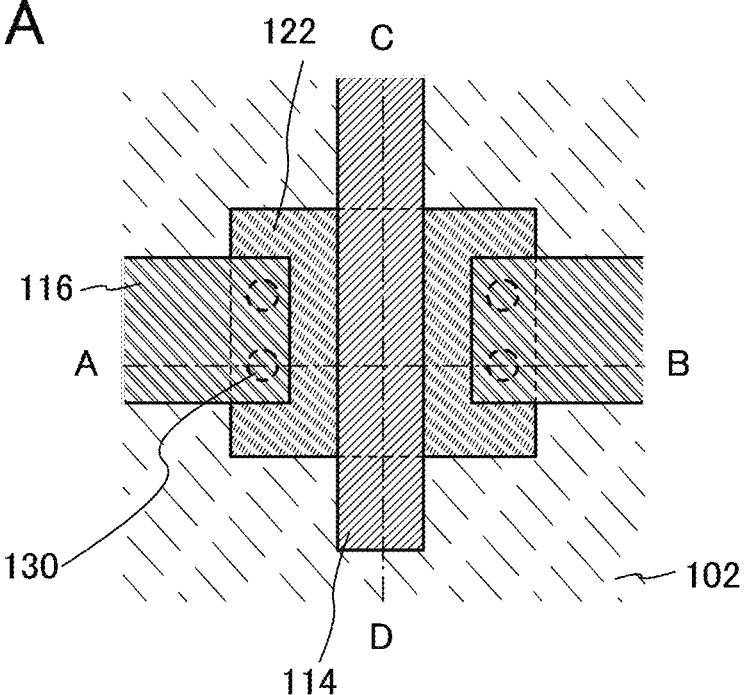
FIGS. 1A to 1C are a top view and cross-sectional views which illustrate an example of a transistor according to one embodiment of the present invention.

Hereinafter, embodiments and examples of the present invention will be described in detail with reference to the accompanying drawings. Note that the present invention is not limited to the description below, and it is easily understood by those skilled in the art that modes and details disclosed herein can be modified in various ways. Therefore, the present invention is not construed as being limited to description of the embodiments and examples. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an example of a top-gate transistor which includes an oxide semiconductor in a channel region and includes an oxynitride semiconductor in a source region and a drain region that are provided in the same layer as the channel region will be described with reference to FIGS. 1A to 1C.

Figure 1B:
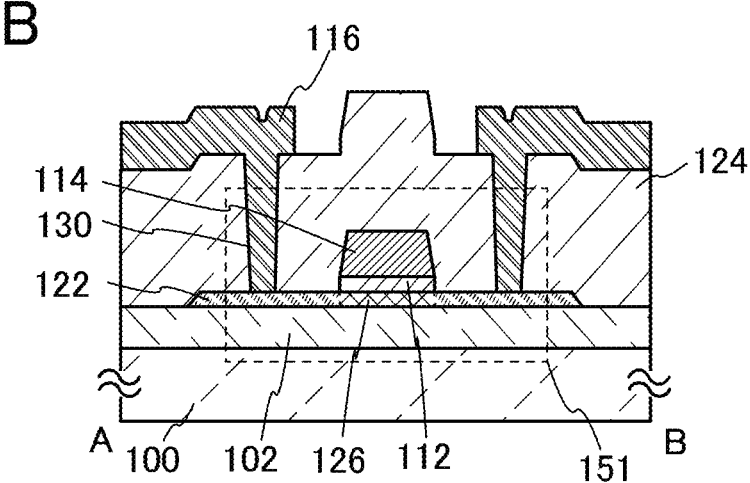
Figure 1C:
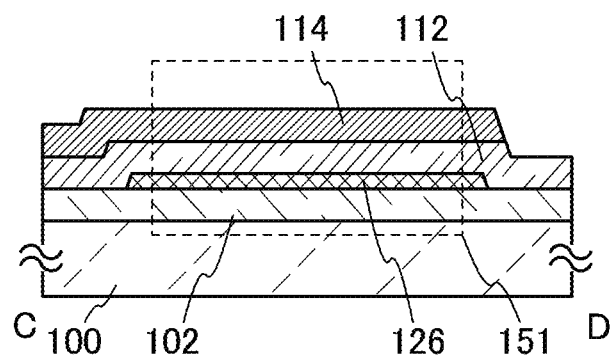

FIGS. 1A to 1C are a top view and cross-sectional views of a top-gate transistor. Here, FIG. 1A is a top view, FIG. 1B is a cross-sectional view taken along A-B in FIG. 1A, and FIG. 1C is a cross-sectional view taken along C-D in FIG. 1A. Note that in FIG. 1A, some components of a transistor 151 (e.g., an interlayer insulating film 124) are omitted for brevity.

The transistor 151 illustrated in FIGS. 1A to 1C includes an oxide semiconductor film over an insulating surface, which includes an oxide semiconductor region 126 and a pair of oxynitride semiconductor regions 122; a gate insulating film 112 over the oxide semiconductor region 126; a gate electrode 114 over the gate insulating film 112; the interlayer insulating film 124 which covers a base insulating film 102, the pair of oxynitride semiconductor regions 122, and the gate electrode 114; and wirings 116 which are connected to the pair of oxynitride semiconductor regions 122 through contact holes 130 provided in the interlayer insulating film 124. In this embodiment, the case where the base insulating film 102 is provided over a substrate 100 as the insulating surface is described.

Here, the pair of oxynitride semiconductor regions 122 serves as a source region and a drain region of the transistor 151, and the oxide semiconductor region 126 serves as a channel region of the transistor 151.

The oxide semiconductor film including the oxide semiconductor region 126 and the pair of oxynitride semiconductor regions 122 may be formed using a material including two or more of In, Ga, Sn, and Zn. For example, the oxide semiconductor region 126 is formed using an In—Ga—Zn—O-based oxide semiconductor, and the pair of oxynitride semiconductor regions 122 is formed using an In—Ga—Zn—O—N-based oxynitride semiconductor.

The nitrogen concentration of the pair of oxynitride semiconductor regions 122 is higher than or equal to 0.01 at. % and lower than or equal to 30 at. %. Note that the nitrogen concentration can be quantified by secondary ion mass spectroscopy (SIMS), X-ray photoelectron spectroscopy (XPS), or an electron probe X-ray microanalyzer (EPMA).

Here, the hydrogen concentration of the pair of oxynitride semiconductor regions 122 is higher than or equal to $1\times10^{19}$ atoms/cm$^3$ and lower than or equal to $1\times10^{22}$ atoms/cm$^3$. The hydrogen concentration of the oxide semiconductor region 126 is lower than or equal to $1\times10^{20}$ atoms/cm$^3$, preferably lower than or equal to $1\times10^{19}$ atoms/cm$^3$, further preferably lower than or equal to $1\times10^{18}$ atoms/cm$^3$. Note that the hydrogen concentration can be quantified by SIMS.

The conductivity of the pair of oxynitride semiconductor regions 122 is higher than or equal to 10 S/cm and lower than or equal to 1000 S/cm, preferably higher than or equal to 100 S/cm and lower than or equal to 1000 S/cm. When the conductivity is lower than 10 S/cm, the on-state current of the transistor is decreased. By setting the conductivity to be lower than or equal to 1000 S/cm, an influence of an electric field applied to the oxide semiconductor region 126 owing to an effect of the pair of oxynitride semiconductor regions 122 can be reduced and thus a short-channel effect can be reduced.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a plastic substrate having sufficient heat resistance may be used. Further alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still further alternatively, any of these substrates provided with a semiconductor element may be used as the substrate 100.

A flexible substrate may be used as the substrate 100. In the case where a transistor is provided over the flexible substrate, the transistor may be formed directly on the flexible substrate, or the transistor may be formed over a different substrate and then separated from the substrate to be transferred to the flexible substrate. In order to separate the transistor from the substrate and transfer it to the flexible substrate, a separation layer is preferably provided between the different substrate and the transistor.

The base insulating film 102 may be a single layer or a stacked layer of any of a silicon oxide film, a silicon oxynitride film, a silicon nitride oxide film, and a silicon nitride film.

In this specification, silicon oxynitride refers to a substance that includes more oxygen than nitrogen and, for example, silicon oxynitride includes oxygen, nitrogen, silicon, and hydrogen at concentrations ranging from greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0 at. % and less than or equal to 10 at. %, respectively. Further, silicon nitride oxide refers to a substance that includes more nitrogen than oxygen and, for example, silicon nitride oxide includes oxygen, nitrogen, silicon, and hydrogen at concentrations ranging from greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that the above ranges are obtained by measurement using Rutherford backscattering spectrometry (RBS) or hydrogen forward scattering spectrometry (HFS). In addition, the total of the percentages of the constituent elements does not exceed 100 at. %.

As the base insulating film 102, a film from which oxygen is released by heating may be used.

To release oxygen by heating means that the amount of released oxygen which is converted into oxygen atoms is greater than or equal to $1.0 \times 10^{18}$ atoms/cm³, preferably greater than or equal to $3.0 \times 10^{20}$ atoms/cm³ in thermal desorption spectroscopy (TDS).

The amount of released oxygen is measured by TDS analysis at a substrate temperature higher than or equal to 150° C. and lower than or equal to 700° C., preferably higher than or equal to 200° C. and lower than or equal to 650° C., further preferably higher than or equal to 250° C. and lower than or equal to 470° C. This is because, for example, it is presumed that oxygen release at a substrate temperature lower than 150° C. is mainly caused by oxygen that is adsorbed to a substrate surface and has relatively low stability. When the substrate temperature is set to be lower than or equal to 700° C., the amount of released oxygen that fits an actual manufacturing process of the transistor can be evaluated.

Here, a method by which the amount of released oxygen in the case of being converted into oxygen atoms is measured using TDS analysis will be described below.

The amount of released gas in TDS analysis is proportional to the integral value of a spectrum. Therefore, the amount of released gas can be calculated from the ratio of the integral value of a spectrum of an insulating film to the reference value of a standard sample. The reference value of a standard sample refers to the ratio of the density of a predetermined atom included in a sample to the integral value of a spectrum.

For example, the number of the released oxygen molecules ($N_{O2}$) from an insulating film can be found according to an equation 1 with the TDS analysis results of a silicon wafer including hydrogen at a predetermined density which is the standard sample and the TDS analysis results of the insulating film. Here, all spectra having a mass number of 32 which are obtained by the TDS analysis are assumed to originate from an oxygen molecule. CH₃OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = N_{H2}/S_{H2} \times S_{O2} \times \alpha \qquad \text{(Equation 1)}$$

$N_{H2}$ is the value obtained by conversion of the number of hydrogen molecules desorbed from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. α is a coefficient affecting the intensity of the spectrum in the TDS analysis. Refer to Japanese Published Patent Application No. H6-275697 for details of the equation 1. Note that the amount of released oxygen from the insulating film is measured with a thermal desorption spectroscopy apparatus manufactured by ESCO Ltd., EMD-WA1000S/W with the use of a silicon wafer including hydrogen atoms at $1 \times 10^{16}$ atoms/cm³ as the standard sample.

Further, in the TDS analysis, part of oxygen is detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. For the insulating film, the amount of released oxygen in the case of being converted into oxygen atoms is twice the number of the released oxygen molecules.

In the above structure, the insulating film from which oxygen is released by heating may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film to the oxide semiconductor region, the interface state density between the base insulating film and the oxide semiconductor region can be reduced. As a result, electric charge or the like which can be generated owing to operation of the transistor or the like can be prevented from being trapped at the interface between the base insulating film and the oxide semiconductor region; accordingly, a transistor having electric characteristics with little deterioration can be obtained.

Further, electric charge is generated owing to an oxygen vacancy in the oxide semiconductor in some cases. In general, when oxygen vacancies are caused in an oxide semiconductor, part of the oxygen vacancies becomes a donor and generates an electron as a carrier. As a result, the threshold voltage of a transistor shifts in the negative direction. This occurs remarkably in an oxygen vacancy caused on the backchannel side. Note that a backchannel in this specification refers to the vicinity of an interface of the oxide semiconductor region on the base insulating film side. Oxygen is sufficiently released from the base insulating film to the oxide semiconductor region, whereby oxygen vacancies in the oxide semiconductor region which cause the negative shift of the threshold voltage can be reduced.

In other words, when an oxygen vacancy is caused in the oxide semiconductor region, it is difficult to suppress trapping of electric charge at the interface between the base insulating film and the oxide semiconductor region. However, by providing an insulating film from which oxygen is released by heating as the base insulating film, the interface state density between the oxide semiconductor region and the base insulating film and oxygen vacancies in the oxide semiconductor region can be reduced and an influence of the trapping of electric charge at the interface between the oxide semiconductor region and the base insulating film can be made small.

The gate insulating film 112 may be formed to have a stacked-layer structure or a single-layer structure using, for example, silicon oxide, silicon oxynitride, silicon nitride oxide, silicon nitride, aluminum oxide, hafnium oxide, or yttria-stabilized zirconia. For example, the gate insulating film 112 may be formed by a thermal oxidation method, a CVD method, or a sputtering method. As the gate insulating film 112, a film from which oxygen is released by heating may be used. A film from which oxygen is released by heating is used as the gate insulating film 112, whereby oxygen vacancies caused in the oxide semiconductor region 126 can be reduced and deterioration of electric characteristics of the transistor can be suppressed.

In the structure described in this embodiment, the gate insulating film 112 has no step portion; therefore, leakage current due to the gate insulating film 112 can be reduced and withstand voltage of the gate insulating film 112 can be increased. For that reason, the transistor can operate normally even when the gate insulating film 112 has an extremely small thickness of approximately 5 nm. Note that a reduction in the thickness of the gate insulating film 112 has effects of reducing a short-channel effect and increasing the operation speed of the transistor.

As a material for the gate electrode 114, a single metal, an alloy, or a metal nitride which includes at least one of aluminum, titanium, chromium, nickel, copper, yttrium, zirconium, molybdenum, silver, tantalum, and tungsten may be used. A transparent conductive material including indium oxide, tin oxide, or zinc oxide may be used. The gate electrode 114 may have a stacked-layer structure of any of the above materials.

The interlayer insulating film 124 may be formed to have a stacked-layer structure or a single-layer structure using, for example, a material such as silicon oxide, silicon oxynitride, silicon nitride oxide, or silicon nitride. For example, the interlayer insulating film 124 may be formed by a thermal oxidation method, a CVD method, or a sputtering method. A silicon nitride film or a silicon nitride oxide film is preferably used as the interlayer insulating film 124.

The wirings 116 may have a structure similar to that of the gate electrode 114.

With such a structure, the transistor 151 has little parasitic capacitance between the gate electrode 114 and the pair of oxynitride semiconductor regions 122 and little variation in the threshold voltage even when the channel length is reduced. Further, the contact resistance between the pair of oxynitride semiconductor regions 122 and the wirings 116 is reduced, and thus the on-state current of the transistor can be increased. Furthermore, the hydrogen concentration in the oxide semiconductor region 126 is reduced, and thus the electric characteristics and reliability of the transistor can be improved.

Figure 4A:
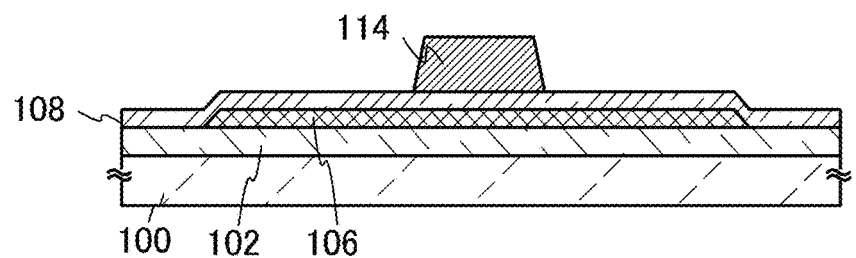
FIGS. 4A to 4D are cross-sectional views which illustrate an example of a manufacturing process of a transistor according to one embodiment of the present invention.
Figure 4B:
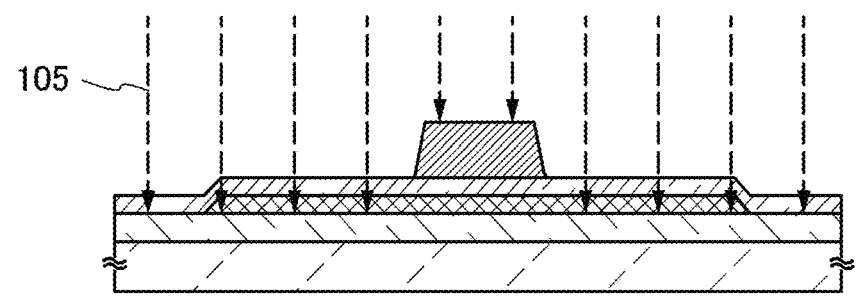
Figure 4C:
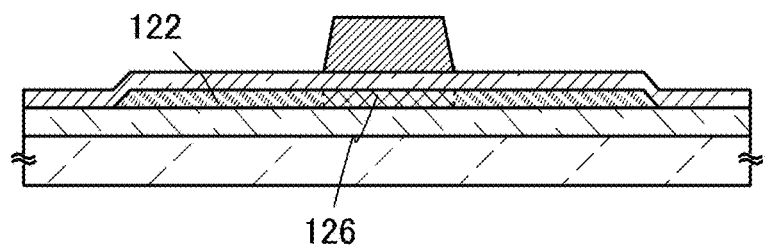
Figure 4D:
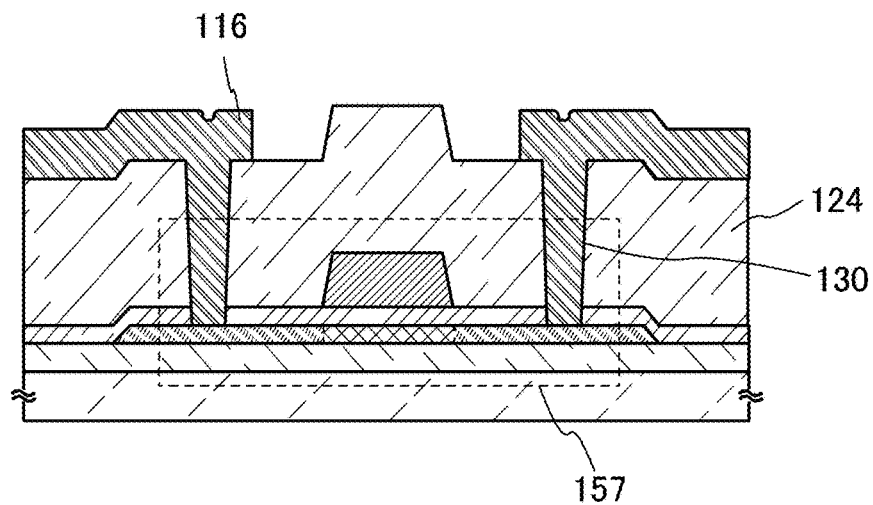

Note that the gate insulating film 112 may be provided to cover the oxide semiconductor region 126 and the pair of oxynitride semiconductor regions 122 as illustrated in FIG. 4D.

This embodiment can be combined with any of the other embodiments as appropriate.

Embodiment 2

In this embodiment, examples of transistors which are different from the transistor described in Embodiment 1 will be described with reference to FIGS. 10A to 10E.

Figure 10A:
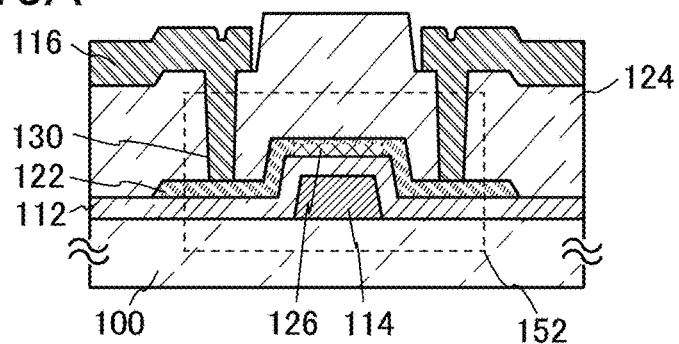
FIGS. 10A to 10E are cross-sectional views which illustrate examples of transistors according to one embodiment of the present invention.

A transistor 152 illustrated in FIG. 10A includes the substrate 100 having an insulating surface; the gate electrode 114 over the substrate 100; the gate insulating film 112 over the gate electrode 114; an oxide semiconductor film which is provided over the gate electrode 114 with the gate insulating film 112 positioned therebetween and includes the oxide semiconductor region 126 and the pair of oxynitride semiconductor regions 122; the interlayer insulating film 124 which covers the oxide semiconductor film and the gate insulating film 112; and the wirings 116 which are connected to the pair of oxynitride semiconductor regions 122 through the contact holes 130 provided in the interlayer insulating film 124. Note that the base insulating film 102 may be provided between the substrate 100 and the transistor 152.

Figure 10B:
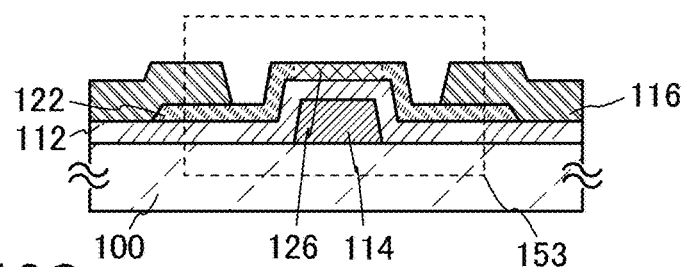

A transistor 153 illustrated in FIG. 10B includes the substrate 100 having an insulating surface; the gate electrode 114 over the substrate 100; the gate insulating film 112 over the gate electrode 114; an oxide semiconductor film which is provided over the gate electrode 114 with the gate insulating film 112 positioned therebetween and includes the oxide semiconductor region 126 and the pair of oxynitride semiconductor regions 122; and the wirings 116 which are connected to the pair of oxynitride semiconductor regions 122. Note that the base insulating film 102 may be provided between the substrate 100 and the transistor 153. Although not illustrated, the interlayer insulating film 124 may be provided over the transistor 153.

Figure 10C:
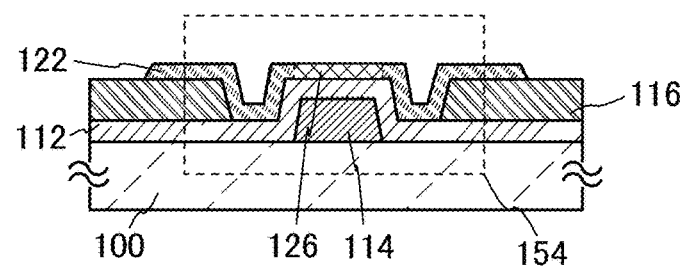

A transistor 154 illustrated in FIG. 10C includes the substrate 100 having an insulating surface; the gate electrode 114 over the substrate 100; the gate insulating film 112 over the gate electrode 114; the wirings 116 over the gate insulating film 112; and an oxide semiconductor film which is provided over the gate electrode 114 with the gate insulating film 112 positioned therebetween and includes the oxide semiconductor region 126 and the pair of oxynitride semiconductor regions 122 connected to the wirings 116. Note that the base insulating film 102 may be provided between the substrate 100 and the transistor 154. Although not illustrated, the interlayer insulating film 124 may be provided over the transistor 154.

Figure 10D:
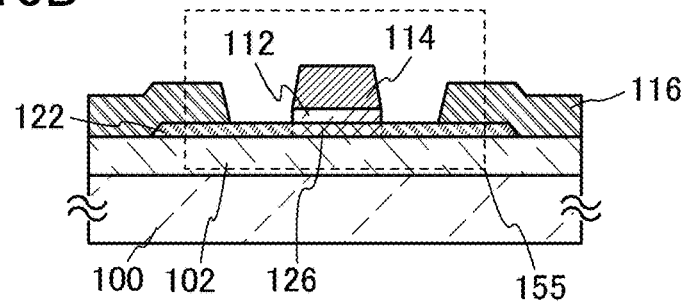

A transistor 155 illustrated in FIG. 10D includes the base insulating film 102 over the substrate 100; an oxide semiconductor film over the base insulating film, which includes the oxide semiconductor region 126 and the pair of oxynitride semiconductor regions 122; the gate insulating film 112 over the oxide semiconductor region 126; the gate electrode 114 over the gate insulating film 112; and the wirings 116 which are connected to the pair of oxynitride semiconductor regions 122. Although not illustrated, the interlayer insulating film 124 may be provided over the transistor 155.

Figure 10E:
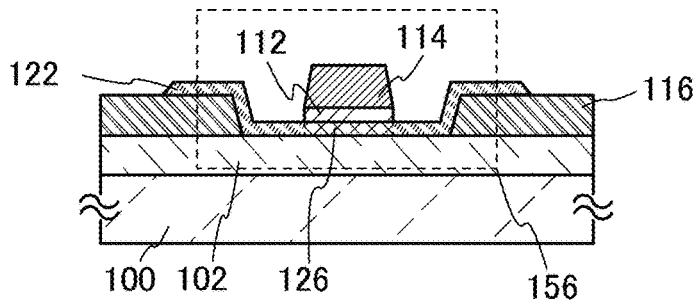

A transistor 156 illustrated in FIG. 10E includes the base insulating film 102 over the substrate 100; the wirings 116 over the base insulating film; an oxide semiconductor film over the base insulating film 102, which includes the oxide semiconductor region 126 and the pair of oxynitride semiconductor regions 122 connected to the wirings 116; the gate insulating film 112 over the oxide semiconductor region 126; and the gate electrode 114 over the gate insulating film 112. Although not illustrated, the interlayer insulating film 124 may be provided over the transistor 156.

The channel length of the transistor is determined by the interval between the pair of oxynitride semiconductor regions 122 or the width of the gate electrode 114. The interval between the pair of oxynitride semiconductor regions 122 is preferably equal to the width of the gate electrode 114 because the pair of oxynitride semiconductor regions 122 and the gate electrode 114 do not overlap with each other; however, the interval between the pair of oxynitride semiconductor regions 122 does not need to be equal to the width of the gate electrode 114. For example, when the width of the gate electrode 114 is narrower than the interval between the pair of oxynitride semiconductor regions 122, an offset region is formed in a region where the gate electrode 114 does not overlap with the oxide semiconductor region; accordingly, concentration of electric fields is reduced, which leads to a reduction in a short-channel effect.

This embodiment can be combined with any of the other embodiments as appropriate.

Embodiment 3

In this embodiment, an example of a method for manufacturing the transistor described in Embodiment 1 will be described.

Figure 2A:
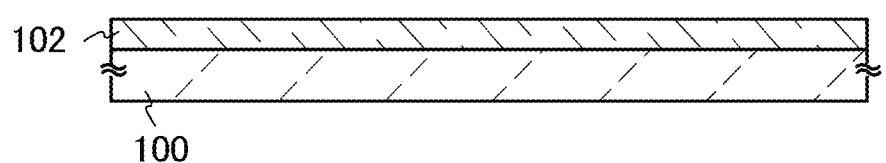
FIGS. 2A to 2C are cross-sectional views which illustrate an example of a manufacturing process of a transistor according to one embodiment of the present invention.

First, the base insulating film 102 is formed over the substrate 100 (see FIG. 2A). The base insulating film 102 may be formed by a sputtering method, a CVD method, or the like.

In the case where the base insulating film is formed by a sputtering method, the base insulating film may be formed using a silicon target, a quartz target, an aluminum target, an aluminum oxide target, or the like and a deposition gas including oxygen. The proportion of oxygen in the deposition gas is 6 vol. % or more, preferably 50 vol. % or more, with respect to the whole deposition gas. By increasing the proportion of the oxygen gas in the deposition gas, an insulating film from which oxygen is released by heating can be formed.

Hydrogen in the target is preferably removed as much as possible. Specifically, an oxide target including an OH group at 100 ppm or lower, preferably 10 ppm or lower, further preferably 1 ppm or lower is used, whereby the hydrogen concentration in the base insulating film 102 can be reduced and thus the electric characteristics and reliability of the transistor can be improved. For example, fused quartz is preferable because it is easily formed so as to include an OH group at 10 ppm or lower and is inexpensive. Needless to say, a target of synthetic quartz having a low OH group concentration may be used.

Figure 2B:
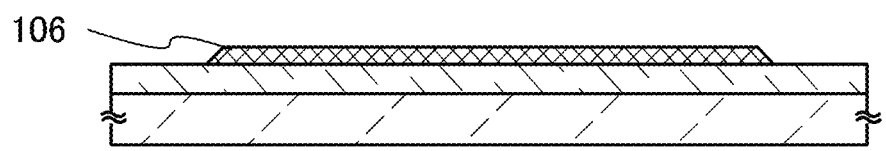

Next, an oxide semiconductor film is formed and then processed, so that an island-shaped oxide semiconductor film 106 is formed (see FIG. 2B). Here, the base insulating film 102 and the oxide semiconductor film may be successively formed in vacuum. For example, after impurities including hydrogen over the surface of the substrate 100 are removed by heat treatment or plasma treatment, the base insulating film 102 may be formed without exposure to the air, and the oxide semiconductor film may be successively formed without exposure to the air. In this manner, impurities including hydrogen over the substrate surface can be reduced, and attachment of an atmospheric component to each interface can be suppressed; accordingly, a highly reliable transistor having favorable electric characteristics can be manufactured. It is more effective to form the oxide semiconductor film in a heating atmosphere.

After formation of the oxide semiconductor film 106, first heat treatment may be performed. The first heat treatment is performed at a temperature higher than or equal to 150° C. and lower than or equal to 650° C., preferably higher than or equal to 250° C. and lower than or equal to 450° C., in an oxidation atmosphere or an inert atmosphere. Here, the oxidation atmosphere refers to an atmosphere including an oxidation gas such as oxygen, ozone, or nitrogen oxide at 10 ppm or higher. The inert atmosphere refers to an atmosphere which includes the oxidation gas at lower than 10 ppm and is filled with nitrogen or a rare gas. The purity of the oxide semiconductor film 106 can be further increased by the first heat treatment, and thus the electric characteristics and reliability of the transistor can be improved. Note that the first heat treatment may be performed immediately after formation of the oxide semiconductor film to be the oxide semiconductor film 106.

Figure 2C:
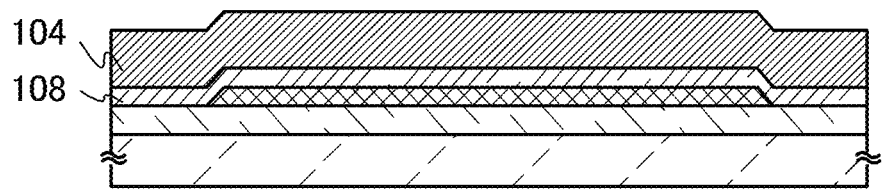

Next, a gate insulating film 108 and a conductive film 104 are formed to cover the oxide semiconductor film 106 (see FIG. 2C). Here, it is preferable that the gate insulating film 108 and the conductive film 104 be successively formed without exposure to the air.

Figure 3A:
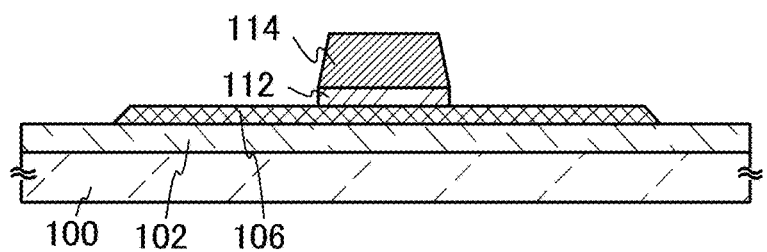
FIGS. 3A to 3D are cross-sectional views which illustrate an example of a manufacturing process of a transistor according to one embodiment of the present invention.

Then, the conductive film 104 and the gate insulating film 108 are processed, so that the gate electrode 114 and the gate insulating film 112 are formed. The gate insulating film 112 is formed directly under the gate electrode 114 (see FIG. 3A). The gate electrode 114 may have a tapered shape. Further, a structure in which the gate electrode 114 has a smaller width so that the gate insulating film 112 extends beyond a region where the gate electrode 114 is formed may be employed. When the gate insulating film 112 is provided to extend beyond the region where the gate electrode 114 is formed, regions where a smaller number of ions are implanted (lightly doped drains (LDDs)) can be formed between a channel region and a source region and between the channel region and a drain region in ion implantation performed in a subsequent step. The LDDs can suppress hot-carrier degradation or the like.

Figure 3B:
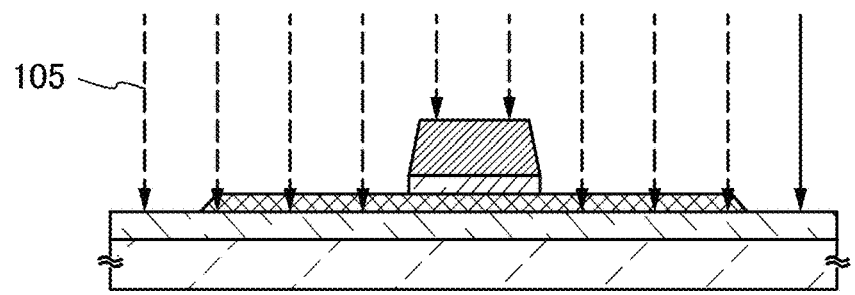

Next, ions 105 are implanted into the oxide semiconductor film 106 (see FIG. 3B). The ions 105 are ions including nitrogen. The ions 105 may be implanted by an ion doping method or an ion implantation method, for example.

Alternatively, the ions 105 can include an ion including nitrogen and an ion including hydrogen.

Figure 3C:
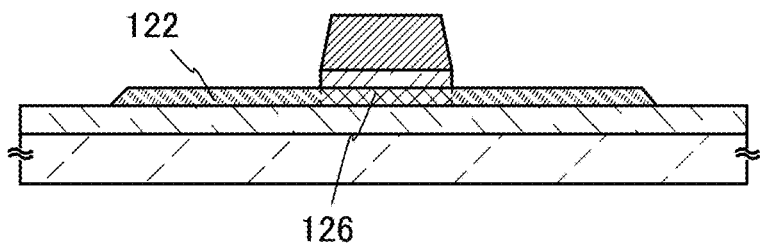

The ions 105 are implanted into a region which is not shielded by the gate electrode 114 and the gate insulating film 112. Thus, the oxide semiconductor region 126 and the pair of oxynitride semiconductor regions 122 can be provided in the oxide semiconductor film (see FIG. 3C).

In the formation of the oxynitride semiconductor regions, part of nitrogen and part of hydrogen are bonded to each other and part of the bonded nitrogen and hydrogen generates carriers in some cases; thus, the oxynitride semiconductor regions have higher conductivity. This bonding between the oxynitride semiconductor regions and hydrogen is stronger than bonding between the oxide semiconductor region and hydrogen. Therefore, hydrogen hardly diffuses into the oxide semiconductor region, and the reliability of the transistor can be improved as compared to the case where the conductivity is increased by simply implanting hydrogen into the oxide semiconductor film.

Next, the interlayer insulating film 124 is formed to cover the base insulating film 102, the pair of oxynitride semiconductor regions 122, and the gate electrode 114. The interlayer insulating film 124 may be formed using a material such as silicon oxide, silicon oxynitride, silicon nitride oxide, or silicon nitride by a sputtering method, a CVD method, or the like. At this time, it is preferable to use a material from which oxygen is less likely to be released by heating. This is for prevention against a decrease in the conductivity of the pair of oxynitride semiconductor regions 122. Specifically, the interlayer insulating film 124 may be formed by a CVD method with the use of a mixture which includes a silane gas as a main material and a proper source gas selected from a nitrogen oxide gas, a nitrogen gas, a hydrogen gas, and a rare gas. In addition, the substrate temperature may be higher than or equal to 150° C. and lower than or equal to 600° C., preferably higher than or equal to 300° C. and lower than or equal to 550° C. By using a CVD method, the interlayer insulating film 124 from which oxygen is less likely to be released by heating can be formed. Moreover, by using a silane gas as a main material, hydrogen remains in the film and diffusion of the hydrogen occurs; accordingly, the conductivity of the pair of oxynitride semiconductor regions 122 can be further increased. The hydrogen concentration in the interlayer insulating film 124 may be higher than or equal to 0.1 at. % and lower than or equal to 25 at. %. Note that the hydrogen concentration can be quantified by SIMS, or RBS and HFS.

The interlayer insulating film 124 has the contact holes 130 reaching the pair of oxynitride semiconductor regions 122. The wirings 116 are formed to be connected to the pair of oxynitride semiconductor regions 122 through the contact holes 130. At this time, with the pair of oxynitride semiconductor regions 122, the contact resistance with the wirings 116 can be reduced as compared to the case of an oxide semiconductor film without the pair of oxynitride semiconductor regions 122.

The wirings 116 may be formed using a material similar to that for the gate electrode 114.

Figure 3D:
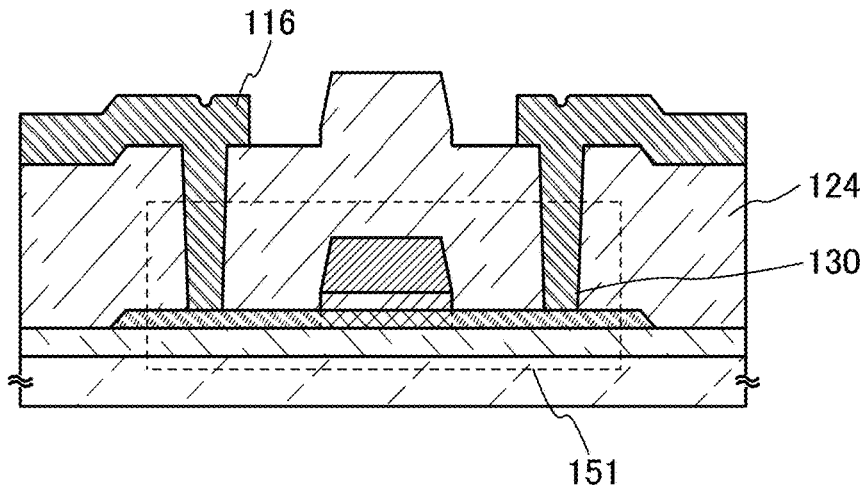

Through the above steps, the transistor 151 can be manufactured (see FIG. 3D).

Although the ions 105 are implanted after the gate insulating film 112 is formed in this embodiment, one embodiment of the present invention is not limited to this; the ions 105 may be implanted through the gate insulating film 108 after the gate electrode 114 is formed, that is, before the gate insulating film 112 is formed. Regions to be the pair of oxynitride semiconductor regions 122 are covered with the gate insulating film 108, whereby damage to the pair of oxynitride semiconductor regions 122 can be reduced. In this case, after implantation of the ions 105, the gate insulating film 108 may be processed using the gate electrode 114 as a mask to be the gate insulating film 112.

In this manner, even when a transistor is miniaturized and the channel length is reduced, a highly reliable transistor which includes an oxide semiconductor and has favorable electric characteristics can be manufactured.

This embodiment can be combined with any of the other embodiments as appropriate.

Embodiment 4

In this embodiment, an example of a method for manufacturing the transistor described in Embodiment 1, which is different from that in Embodiment 3, will be described.

Steps up to and including the step in FIG. 2C are similar to those in Embodiment 3.

After that, the conductive film 104 is processed, so that the gate electrode 114 is formed (see FIG. 4A).

Next, the ions 105 are implanted through the gate insulating film 108 (see FIG. 4B), so that the oxide semiconductor region 126 and the pair of oxynitride semiconductor regions 122 are formed (see FIG. 4C).

Then, the interlayer insulating film 124 and the contact holes 130 are formed. The contact holes 130 are also provided in the gate insulating film 108.

Next, the wirings 116 are formed to be connected to the pair of oxynitride semiconductor regions 122 through the contact holes 130.

Through the above steps, a transistor 157 can be manufactured (see FIG. 4D).

Regions where the pair of oxynitride semiconductor regions 122 is formed are protected by the gate insulating film 108, whereby damage to the pair of oxynitride semiconductor regions 122 can be reduced. Moreover, since the gate insulating film 108 is also provided over the pair of oxynitride semiconductor regions 122, generation of leakage current between the gate electrode 114 and the pair of oxynitride semiconductor regions 122 can be suppressed.

This embodiment can be combined with any of the other embodiments as appropriate.

Embodiment 5

Figure 8A:
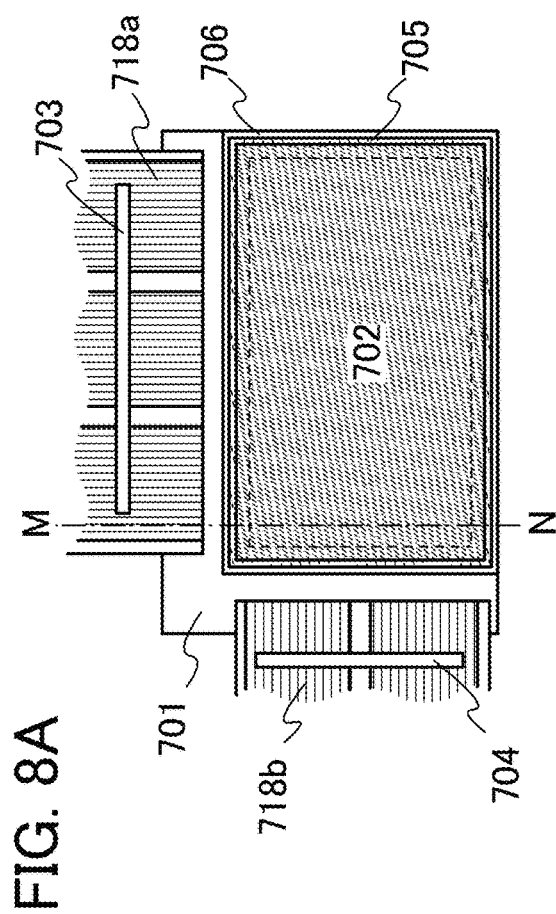
FIGS. 8A and 8B are a top view and a cross-sectional view which illustrate an example of a display device including a transistor according to one embodiment of the present invention.
Figure 8B:
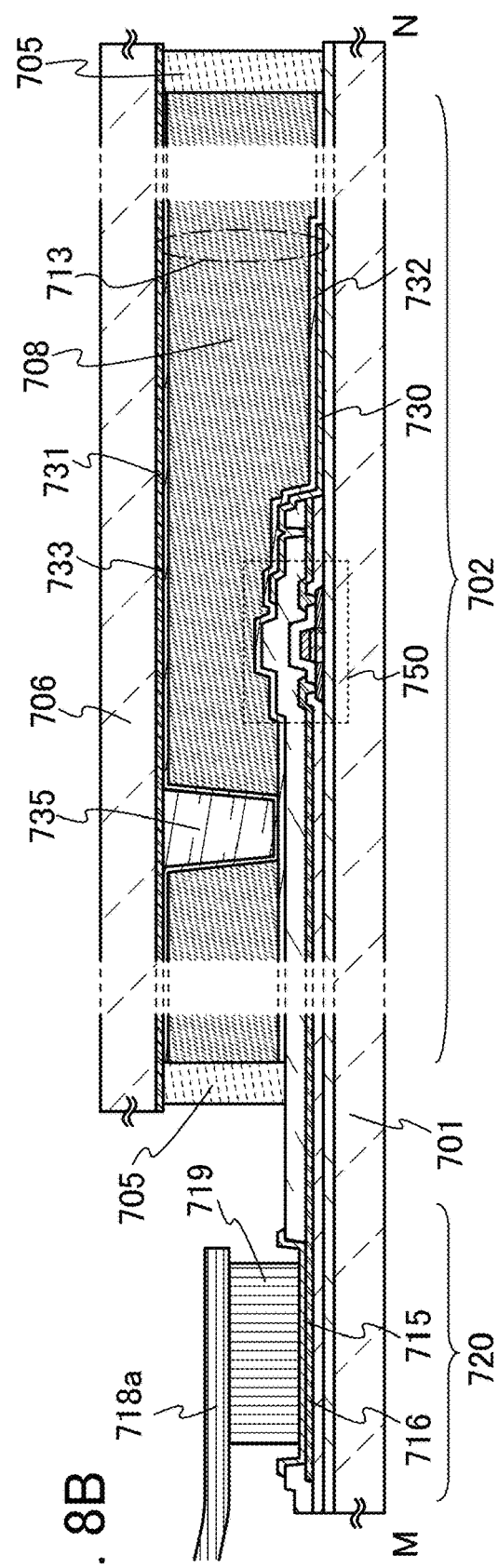

One mode of a display device including any of the transistors exemplified in Embodiments 1 to 4 is illustrated in FIGS. 8A and 8B.

FIG. 8A is a top view of a panel. In the panel, a transistor 750 and a liquid crystal element 713 are sealed between a first substrate 701 and a second substrate 706 by a sealant 705. FIG. 8B is a cross-sectional view taken along M-N in FIG. 8A.

The sealant 705 is provided so as to surround a pixel portion 702 provided over the first substrate 701. The second substrate 706 is provided over the pixel portion 702. Thus, the pixel portion 702 is sealed together with a liquid crystal layer 708 by the first substrate 701, the sealant 705, and the second substrate 706.

Further, an input terminal 720 is provided in a region that is different from a region surrounded by the sealant 705 over the first substrate 701, and flexible printed circuits (FPCs) 718a and 718b are connected to the input terminal 720. The FPC 718a is electrically connected to a signal line driver circuit 703 which is separately provided over another substrate, and the FPC 718b is electrically connected to a scan line driver circuit 704 which is separately provided over another substrate. A variety of signals and potentials supplied to the pixel portion 702 are supplied from the signal line driver circuit 703 and the scan line driver circuit 704 through the FPC 718a and the FPC 718b.

Note that there is no particular limitation on a connection method of a driver circuit which is separately provided over another substrate, and a chip on glass (COG) method, a wire bonding method, a tape carrier package (TCP) method, a tape automated bonding (TAB) method, or the like can be used.

As a display element provided in the display device, a liquid crystal element (also referred to as a liquid crystal display element) can be used. Further, a display medium whose contrast is changed by an electric effect, such as electronic ink, can be used.

The display device illustrated in FIGS. 8A and 8B includes an electrode 715 and a wiring 716. The electrode 715 and the wiring 716 are electrically connected to a terminal included in the FPC 718a through an anisotropic conductive film 719.

The electrode 715 is formed using the same conductive film as a first electrode 730. The wiring 716 is formed using the same conductive film as a source electrode and a drain electrode of the transistor 750.

Note that the transistor 750 provided in the pixel portion 702 is electrically connected to a display element to form a display panel. A variety of display elements can be used as the display element as long as display can be performed.

An example of a display device using a liquid crystal element as a display element is illustrated in FIGS. 8A and 8B. In FIGS. 8A and 8B, the liquid crystal element 713 is a display element including the first electrode 730, a second electrode 731, and the liquid crystal layer 708. Note that an insulating film 732 and an insulating film 733 which function as alignment films are provided so that the liquid crystal layer 708 is interposed therebetween. The second electrode 731 is provided on the second substrate 706 side, and the first electrode 730 and the second electrode 731 are stacked with the liquid crystal layer 708 positioned therebetween.

Further, a spacer 735 is a columnar spacer formed of an insulating film over the second substrate 706 in order to control the thickness (a cell gap) of the liquid crystal layer 708. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used for the liquid crystal layer 708. A blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which a chiral agent is mixed is used for the liquid crystal layer in order to improve the temperature range. The liquid crystal composition which includes a liquid crystal exhibiting a blue phase and a chiral agent has a short response time of 1 millisecond or less and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be improved.

The specific resistivity of the liquid crystal material is $1\times10^9$ Ω·cm or higher, preferably $1\times10^{11}$ Ω·cm or higher, further preferably $1\times10^{12}$ Ω·cm or higher. The value of the specific resistivity in this specification is measured at 20° C.

The size of a storage capacitor provided in the liquid crystal display device is set considering the leakage current of the transistor provided in the pixel portion or the like so that electric charge can be held for a predetermined period. By using a transistor including an oxide semiconductor in a semiconductor film where a channel region is formed, it is enough to provide a storage capacitor having capacitance that is ⅓ or less, preferably ⅕ or less of liquid crystal capacitance of each pixel.

In the transistor which includes the oxide semiconductor film and is used in this embodiment, the hydrogen concentration in the channel region that is an oxide semiconductor region can be reduced because a source region and a drain region that are oxynitride regions have an effect of occluding hydrogen. Accordingly, the current in an off state (off-state current) can be reduced. Therefore, an electric signal such as an image signal can be held for a longer period, and a writing interval can be set longer in an on state. Accordingly, the frequency of refresh operation can be reduced, which leads to an effect of suppressing power consumption. Further, the transistor including the oxide semiconductor film can hold a potential supplied to a liquid crystal element even when a capacitor is not specially provided or the capacitance of a specially provided capacitor is extremely low.

In addition, the transistor which includes the oxide semiconductor film and is used in this embodiment can have relatively high field-effect mobility and thus can operate at high speed. Therefore, by using the transistor in a pixel portion of a liquid crystal display device, a high-quality image can be provided. In addition, since such transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. The vertical alignment mode is a method for controlling alignment of liquid crystal molecules of a liquid crystal display panel, in which liquid crystal molecules are aligned vertically to a panel surface when no voltage is applied. Some examples can be given as the vertical alignment mode. For example, a multi-domain vertical alignment (MVA) mode, a patterned vertical alignment (PVA) mode, or an advanced super view (ASV) mode can be used. Moreover, it is possible to use a method called domain multiplication or multi-domain design, in which a pixel is divided into some regions (subpixels) and molecules are aligned in different directions in their respective regions.

In the liquid crystal display device, a black matrix (a light-blocking layer); an optical member (an optical substrate) such as a polarizing member, a retardation member, or an anti-reflection member; and the like are provided as appropriate. For example, circular polarization may be employed by using a polarizing substrate and a retardation substrate. In addition, a backlight, a side light, or the like may be used as a light source.

In addition, it is possible to employ a time-division display method (a field-sequential driving method) with the use of a plurality of light-emitting diodes (LEDs) as a backlight. By employing a field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may differ between respective dots of color elements. However, one embodiment of the present invention is not limited to a liquid crystal display device for color display and can be applied to a liquid crystal display device for monochrome display.

In FIGS. 8A and 8B, a flexible substrate as well as a glass substrate can be used as the first substrate 701 and the second substrate 706. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The liquid crystal display device performs display by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode and the second electrode (each of which is also referred to as a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 730 and the second electrode 731 can be formed using a light-transmitting conductive material such as indium oxide including tungsten oxide, indium zinc oxide including tungsten oxide, indium oxide including titanium oxide, indium tin oxide including titanium oxide, indium tin oxide (also referred to as ITO), indium zinc oxide, or indium tin oxide to which silicon oxide is added. Alternatively, a material formed of one to ten graphene sheets may be used.

One of the first electrode 730 and the second electrode 731 can be formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

The first electrode 730 and the second electrode 731 can be formed using a conductive composition including a conductive macromolecule (also referred to as a conductive polymer). As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Further, since a transistor is easily broken by static electricity or the like, a protection circuit is preferably provided. The protection circuit is preferably formed using a nonlinear element.

As described above, by using any of the transistors exemplified in Embodiments 1 to 4, a highly reliable liquid crystal display device can be provided. Note that the transistors exemplified in Embodiments 1 to 4 can be applied to not only semiconductor devices having the display functions described above but also semiconductor devices having a variety of functions, such as a power device which is mounted on a power supply circuit, a semiconductor integrated circuit such as LSI, and a semiconductor device having an image sensor function of reading information of an object.

This embodiment can be freely combined with any of the other embodiments.

Embodiment 6

A semiconductor device which is one embodiment of the present invention can be applied to a variety of electronic devices (including game machines). Examples of electronic devices include a television device (also referred to as a television or a television receiver), a monitor of a computer or the like, a camera such as a digital camera or a digital video camera, a digital photo frame, a mobile phone (also referred to as a cellular phone or a mobile phone device), a portable game machine, a personal digital assistant, an audio reproducing device, and a large-sized game machine such as a pachinko machine. Examples of electronic devices each including the semiconductor device described in any of the above embodiments will be described.

Figure 9A:
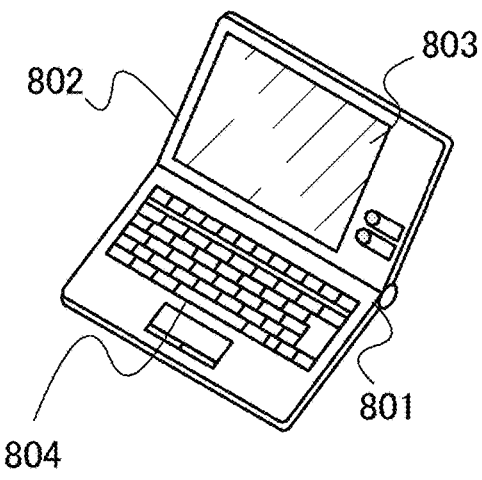
FIGS. 9A to 9D are perspective views which illustrate examples of electronic devices each including a transistor according to one embodiment of the present invention.

FIG. 9A illustrates a laptop personal computer including a main body 801, a housing 802, a display portion 803, a keyboard 804, and the like. By applying the semiconductor device described in any of Embodiments 1 to 5, the laptop personal computer can have high reliability.

Figure 9B:
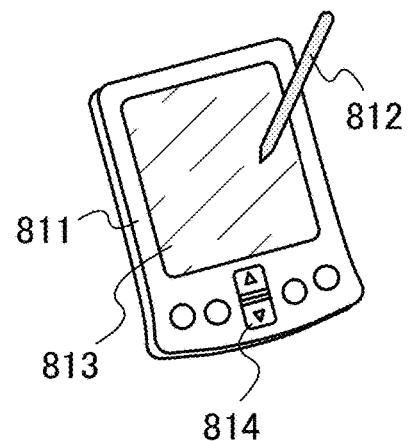

FIG. 9B illustrates a personal digital assistant (PDA) including a display portion 813, an operation button 814, and the like in a main body 811. A stylus 812 is provided as an accessory for operation. By applying the semiconductor device described in any of Embodiments 1 to 5, the personal digital assistant (PDA) can have higher reliability.

Figure 9C:
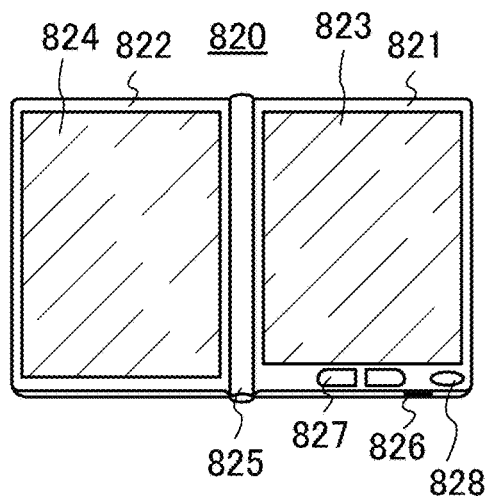

FIG. 9C illustrates an example of an e-book reader. For example, an e-book reader 820 includes two housings, a housing 821 and a housing 822. The housings 821 and 822 are combined with a hinge 825 so that the e-book reader 820 can be opened and closed using the hinge 825 as an axis. With such a structure, the e-book reader 820 can operate like a paper book.

A display portion 823 and a display portion 824 are incorporated in the housing 821 and the housing 822, respectively. The display portion 823 and the display portion 824 may display one image or different images. In the case where the display portions display different images, for example, the right display portion (the display portion 823 in FIG. 9C) can display text and the left display portion (the display portion 824 in FIG. 9C) can display illustrations. By applying the semiconductor device described in any of Embodiments 1 to 5, the e-book reader can have high reliability.

Further, in FIG. 9C, the housing 821 is provided with an operation portion and the like. For example, the housing 821 is provided with a power switch 826, an operation key 827, a speaker 828, and the like. With the operation key 827, pages can be turned. Note that a keyboard, a pointing device, or the like may also be provided on the surface of the housing, on which the display portion is provided. Further, an external connection terminal (such as an earphone terminal or a USB terminal), a recording medium insertion portion, and the like may be provided on the back surface or the side surface of the housing. Furthermore, the e-book reader 820 may have a function of an electronic dictionary.

The e-book reader 820 may send and receive data wirelessly. Through wireless communication, desired book data or the like can be purchased and downloaded from an electronic book server.

Figure 9D:
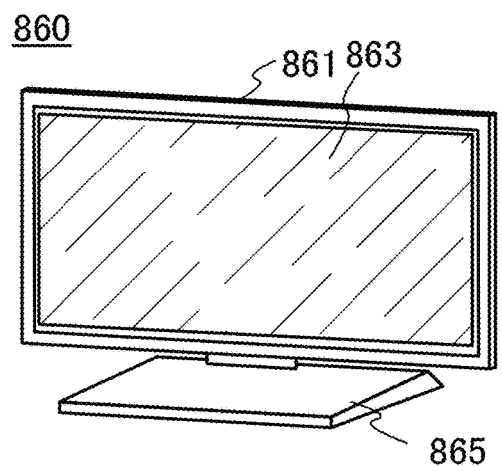

FIG. 9D illustrates an example of a television device. In a television device 860, a display portion 863 is incorporated in a housing 861. The display portion 863 can display images. Here, the housing 861 is supported by a stand 865. By applying the semiconductor device described in any of Embodiments 1 to 5, the television device 860 can have high reliability.

The television device 860 can be operated by an operation switch of the housing 861 or a separate remote controller. Further, the remote controller may be provided with a display portion for displaying data output from the remote controller.

Note that the television device 860 is provided with a receiver, a modem, and the like. With the use of the receiver, general television broadcasting can be received. Moreover, the television device is connected to a communication network with or without wires via the modem, one-way (from a sender to a receiver) or two-way (between a sender and a receiver or between receivers) data communication can be performed.

The structure, the method, and the like described in this embodiment may be combined with those described in the other embodiments as appropriate.

Example 1

In this example, a specific example of an oxynitride semiconductor film which was formed by a sputtering method with the use of an In—Ga—Zn—O target will be shown, and physical properties and a band diagram thereof will be described.

Deposition conditions of Condition 1 are as follows.
Deposition method: a DC sputtering method
Target: an In—Ga—Zn—O target (the atomic ratio is In:Ga:Zn:O=1:1:1:4)
Deposition power: 500 W
Deposition gas: $O_2$, 40 sccm
Deposition pressure: 0.4 Pa
T-S distance: 60 mm
Substrate temperature in deposition: 200° C.
Film thickness: 100 nm Deposition conditions of Condition 2 are as follows.
Deposition method: a DC sputtering method
Target: an In—Ga—Zn—O target (the atomic ratio is In:Ga:Zn:O=1:1:1:4)
Deposition power: 500 W
Deposition gas: $N_2$, 40 sccm
Deposition pressure: 0.4 Pa
T-S distance: 60 mm
Substrate temperature in deposition: 200° C.
Film thickness: 100 nm Films of Condition 1 and Condition 2, which were each formed over a quartz substrate, are referred to as a sample 1 and a sample 2, respectively. Ultraviolet photoelectron spectroscopy (UPS) was performed on the sample 1 and the sample 2 to evaluate ionization potentials; the ionization potential of the sample 1 was 7.8 eV and that of the sample 2 was 7.6 eV.

Next, spectroscopic spectral data of the sample 1 and the sample 2 was obtained with the use of a spectroscopic ellipsometer (UT-300 manufactured by HORIBA Jobin Yvon), and the spectroscopic spectral data was analyzed and an absorption coefficient α was derived.

Then, $(\alpha h v)^{1/2}$ and hv were plotted on the vertical axis and the horizontal axis, respectively (Tauc plot), a tangent through a linear portion was drawn, and an intersection of the tangent and the horizontal axis hv was employed as an optical bandgap. Here, h represents the Planck constant, and v represents the frequency of light.

The optical bandgaps of the sample 1 and the sample 2, which were estimated in this manner, were 3.2 eV and 1.7 eV, respectively.

Here, a band structure in the case where an oxynitride semiconductor is used for a source and a drain and an oxide semiconductor is used for a channel will be described with reference to FIGS. 5A to 5C.

Figure 5A:
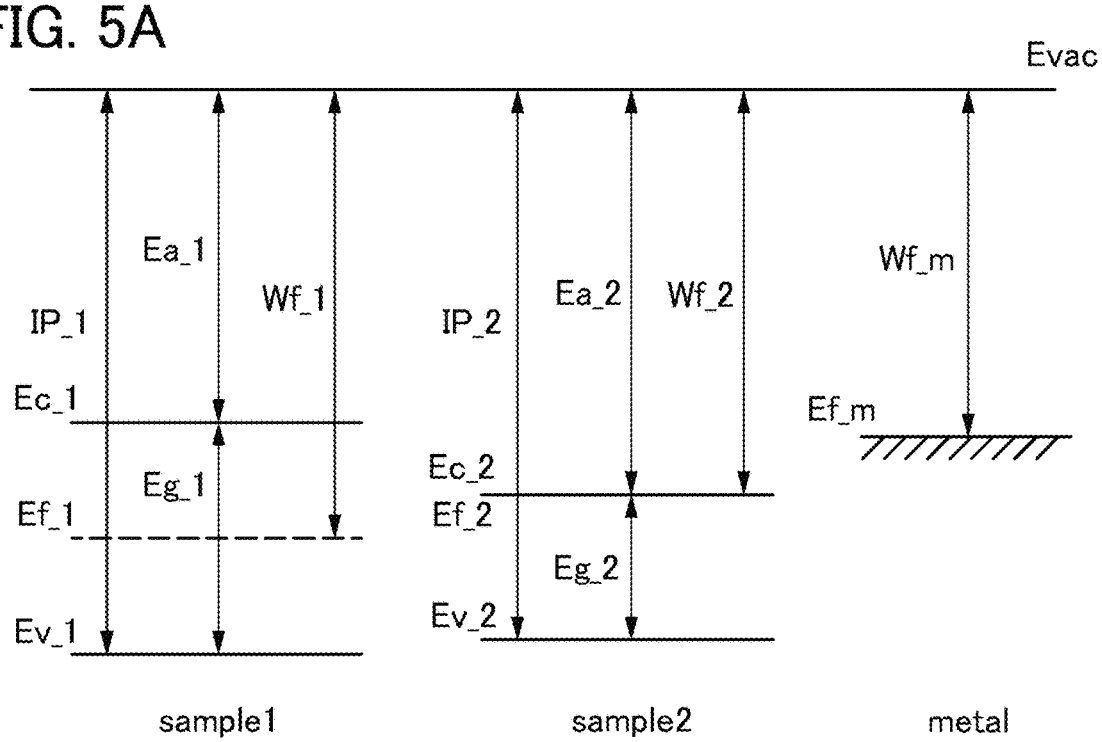
FIGS. 5A to 5C illustrate band structures of an oxide semiconductor, an oxynitride semiconductor, and a metal material.

FIG. 5A shows a relation between a vacuum level Evac and levels of the sample 1, the sample 2, and a metal. Here, IP represents the ionization potential; Ea, the electron affinity; Eg, the energy gap; and Wf, the work function. In addition, Ec represents the conduction band minimum; Ev, the valence band maximum; and Ef, the Fermi level. As for a sign at the end of each symbol, 1 denotes the sample 1, 2 denotes the sample 2, and m denotes the metal. Here, a metal having a work function of 4.8 eV (such as tungsten or molybdenum) is assumed as the metal.

Here, the sample 1 is an extremely purified semiconductor and thus has extremely low carrier density; therefore, Ef_1 is around the middle point between Ec and Ev. The sample 2 is an n-type semiconductor having high carrier density, and thus Ec_2 generally corresponds to Ef_2.

Table 1 shows the ionization potentials, energy gaps, electron affinities, and work functions of the sample 1, the sample 2, and the metal in that case. Note that a relation $Wf\_1=Ea\_1+(\frac{1}{2})\cdot Eg\_1$ and a relation $Wf\_2=Ea\_2$ are satisfied.

TABLE 1

|  | IP [eV] | Eg [eV] | Ea [eV] | Wf [eV] |
| --- | --- | --- | --- | --- |
| sample1 | 7.8 | 3.2 | 4.6 | 6.2 |
| sample2 | 7.6 | 1.7 | 5.9 | 5.9 |
| metal | — | — | — | 4.8 |

Figure 5B:
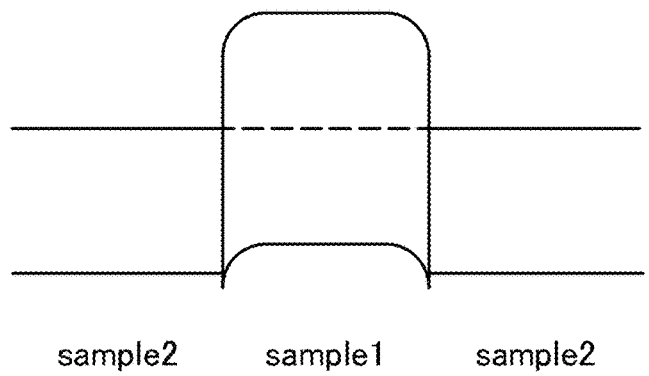

FIG. 5B shows a band structure in the case where a channel is connected to a source and a drain as in the semiconductor device described in Embodiment 1 of the present invention. That is, when the sample 1 that is a channel is in contact with the sample 2 that is a source and a drain, carriers transfer so that the Fermi level becomes uniform and thus a band edge of the sample 1 is curved.

Figure 5C:
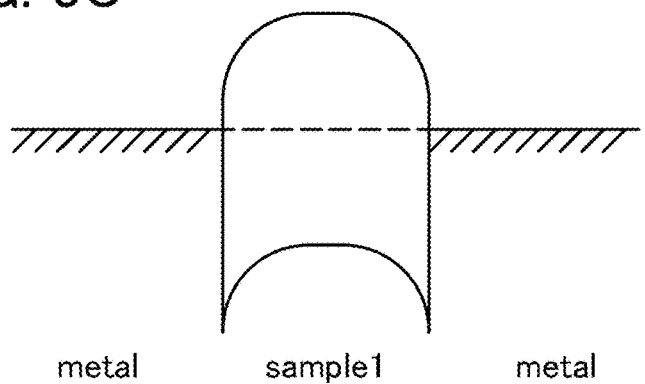

FIG. 5C shows, as a comparative example, a band structure in the case where the metal that is a source and a drain is in contact with the sample 1 that is a channel. Also in this case, carriers transfer so that the Fermi level becomes uniform and the band edge of the sample 1 is curved; however, the band edge is curved significantly as compared to the case where the sample 2 is in contact with the sample 1 because of a relation $Wf\_2 > Wf\_m$. Owing to such a large curve of the band, in the case of reducing the channel length of a transistor for miniaturization, the rate at which the effective channel length is reduced is higher than the rate at which the channel length is actually reduced. In other words, a short-channel effect is enhanced and there is a possibility of a shift of the threshold voltage of the transistor or an increase in variation in electric characteristics within a substrate surface. This tendency is remarkable in the case where a material having a low work function is used for the source and the drain. In this example, a metal material having a relatively high work function of 4.8 eV is assumed as the metal; a metal material having a higher work function is rare or very expensive, and thus is not practical.

Accordingly, it is found that when the sample 1 that is an oxide semiconductor is used for a channel of a transistor and the sample 2 that is an oxynitride semiconductor is used for a source and a drain thereof, a short-channel effect of the transistor can be reduced as compared to the case where a metal material is used for the source and the drain.

Example 2

In this example, diffusion of hydrogen in an oxide semiconductor and an oxynitride semiconductor will be described with reference to FIG. 6.

A sample has the following structure.

An oxide semiconductor film 551 was formed over a glass substrate, an oxide semiconductor film 552 was formed over the oxide semiconductor film 551, and an oxynitride semiconductor film 553 was formed over the oxide semiconductor film 552.

Deposition conditions of the oxide semiconductor film 551 are as follows.
Deposition method: a DC sputtering method
Target: an In—Ga—Zn—O target (the atomic ratio is In:Ga:Zn:O=2:2:1:7)
Deposition power: 500 W
Deposition gas: Ar, 40 sccm
Deposition pressure: 0.4 Pa
T-S distance: 60 mm
Substrate temperature in deposition: RT
Film thickness: 100 nm
Deposition conditions of the oxide semiconductor film 552 are as follows.
Deposition method: a DC sputtering method
Target: an In—Ga—Zn—O target (the atomic ratio is In:Ga:Zn:O=2:2:1:7)
Deposition power: 500 W
Deposition gas: Ar, 30 sccm; $O_2$, 15 sccm
Deposition pressure: 0.4 Pa
T-S distance: 60 mm
Substrate temperature in deposition: RT
Film thickness: 100 nm
Deposition conditions of the oxynitride semiconductor film 553 are as follows.
Deposition method: a DC sputtering method
Target: an In—Ga—Zn—O target (the atomic ratio is In:Ga:Zn:O=2:2:1:7)
Deposition power: 500 W
Deposition gas: Ar, 35 sccm; $N_2$, 5 sccm
Deposition pressure: 0.4 Pa
T-S distance: 60 mm
Substrate temperature in deposition: RT
Film thickness: 200 nm SIMS was performed on the above sample before and after heat treatment, and the concentrations of hydrogen and nitrogen were evaluated. The heat treatment was performed with the use of a resistance heating furnace at 350° C. for 1 hour in a nitrogen atmosphere.

Figure 6:
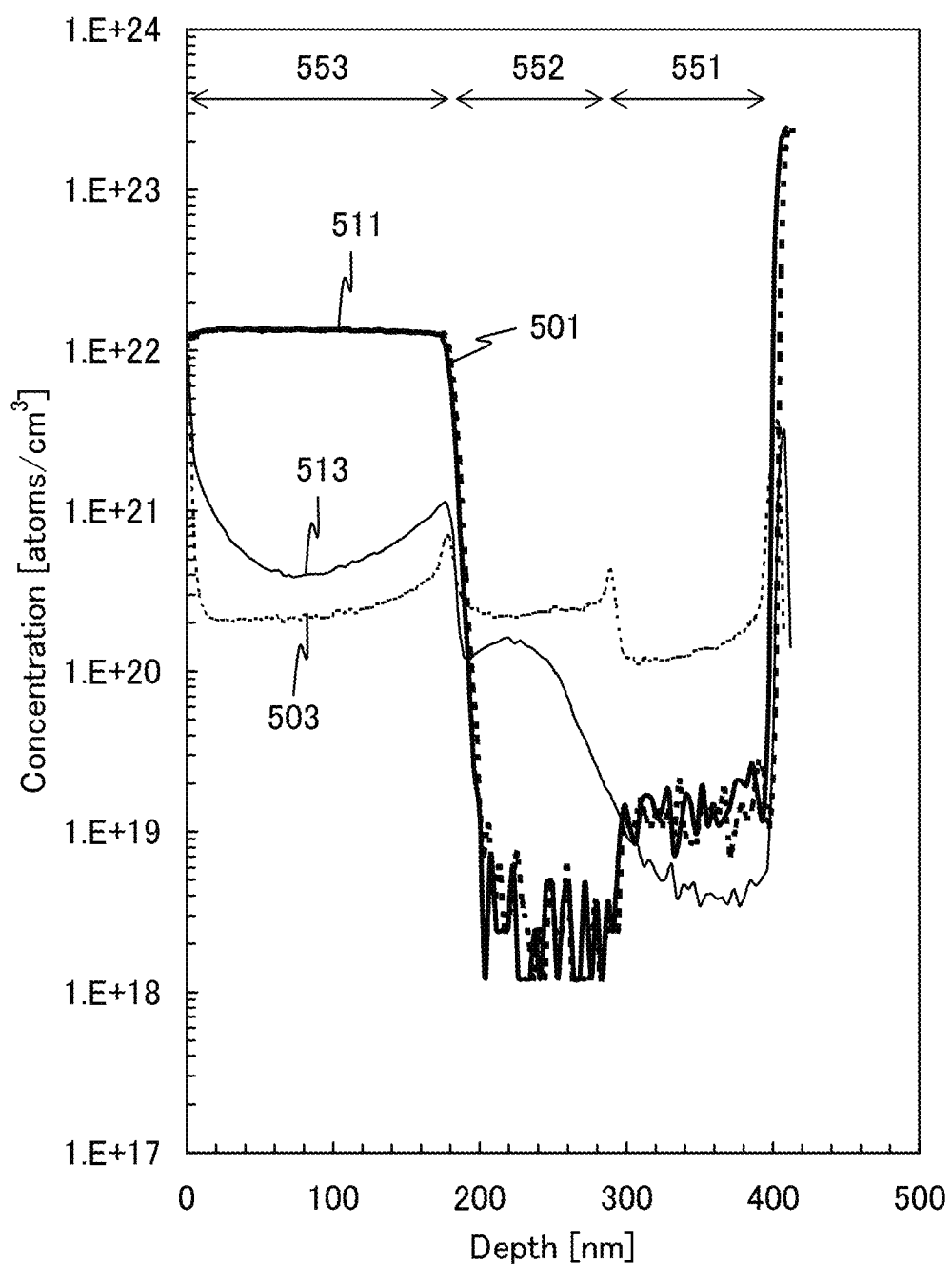
FIG. 6 shows diffusion of hydrogen in an oxide semiconductor and an oxynitride semiconductor.

FIG. 6 shows results of SIMS. The horizontal axis represents the depth of the sample, and the vertical axis represents the concentrations of hydrogen and nitrogen. Note that the depth in SIMS in this specification is an approximate value estimated from the etching rate of a silicon oxide film and does not always match an actual depth; therefore, the depth in SIMS is used only as an indication. A thick dotted line 501 represents the nitrogen concentration of the sample on which the heat treatment was not performed (as-depo); a thin dotted line 503, the hydrogen concentration of as-depo; a thick solid line 511, the nitrogen concentration after the heat treatment; and a thin solid line 513, the hydrogen concentration after the heat treatment. Note that ranges indicated by three double-headed arrows respectively denote the oxide semiconductor film 551, the oxide semiconductor film 552, and the oxynitride semiconductor film 553.

According to a comparison between the state of as-depo and the state after the heat treatment, the hydrogen concentration is decreased in the oxide semiconductor film 551 and the oxide semiconductor film 552 and increased in the oxynitride semiconductor film 553. That is, the results indicate that hydrogen diffused from the oxide semiconductor film 551 and the oxide semiconductor film 552 into the oxynitride semiconductor film 553.

Note that no difference was observed in the nitrogen concentration in each layer between before and after the heat treatment.

Consequently, it was found that an oxynitride semiconductor easily occludes hydrogen and hardly releases hydrogen as compared to an oxide semiconductor.

Example 3

In this example, diffusion of nitrogen in an oxide semiconductor and an oxynitride semiconductor will be described with reference to FIG. 7.

A sample was obtained in the following manner: an oxynitride semiconductor film 651 was formed over a glass substrate, and an oxide semiconductor film 652 was formed over the oxynitride semiconductor film 651.

Deposition conditions of the oxynitride semiconductor film 651 are as follows.
Deposition method: a DC sputtering method
Target: an In—Ga—Zn—O target (the atomic ratio is In:Ga:Zn:O=1:1:1:4)
Deposition power: 500 W
Deposition gas: Ar, 35 sccm; $N_2$, 5 sccm Deposition pressure: 0.4 Pa
T-S distance: 60 mm
Substrate temperature in deposition: 200° C.
Film thickness: 100 nm Deposition conditions of the oxide semiconductor film 652 are as follows.
Deposition method: a DC sputtering method
Target: an In—Ga—Zn—O target (the atomic ratio is In:Ga:Zn:O=1:1:1:4)
Deposition power: 500 W
Deposition gas: Ar, 30 sccm; $O_2$, 15 sccm
Deposition pressure: 0.4 Pa
T-S distance: 60 mm
Substrate temperature in deposition: 200° C.
Film thickness: 200 nm SIMS was performed on the above sample before and after heat treatment, and the nitrogen concentration was evaluated. The heat treatment was performed with the use of a resistance heating furnace at 450° C. or 650° C. for 1 hour in a nitrogen atmosphere.

Figure 7:
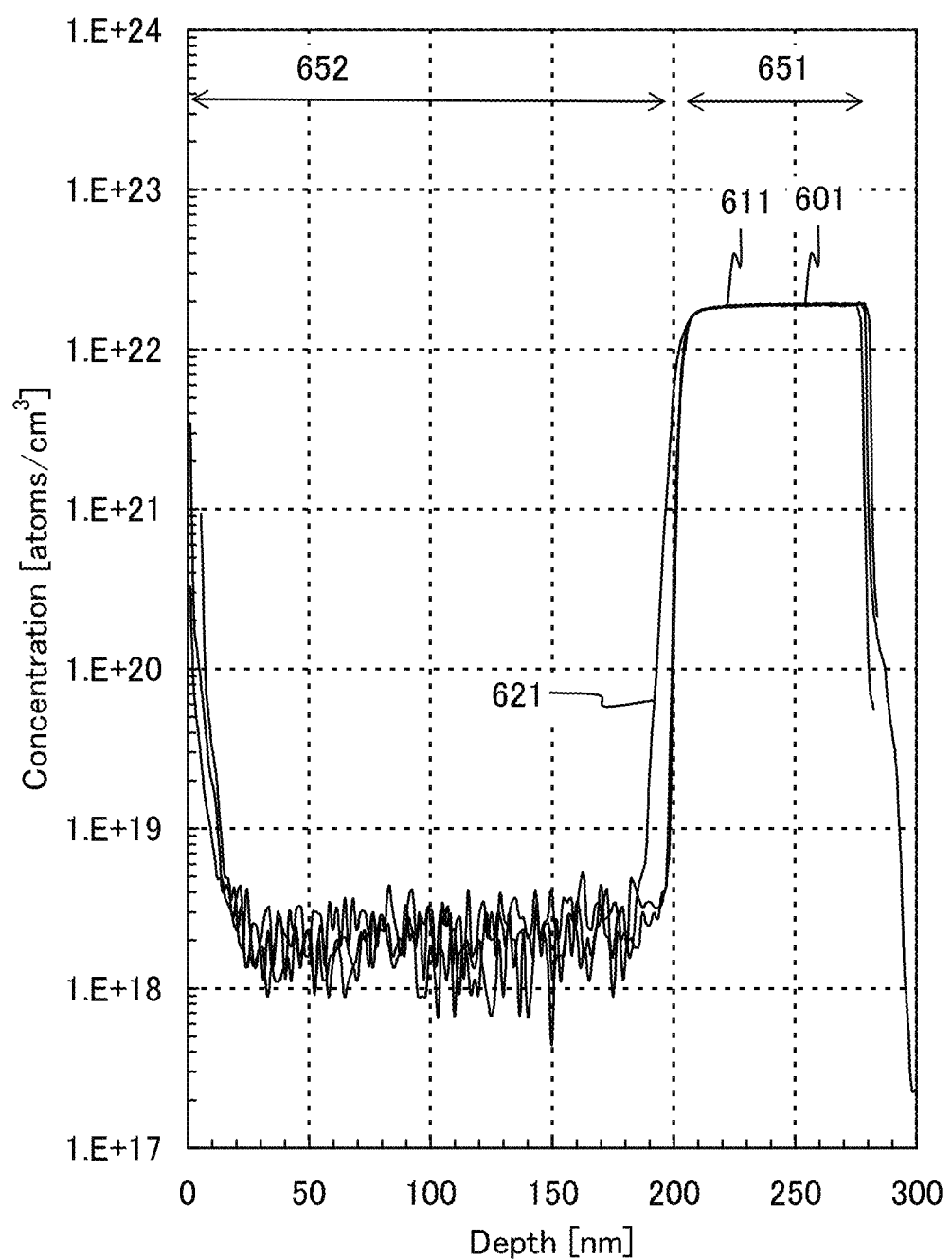
FIG. 7 shows diffusion of nitrogen in an oxide semiconductor and an oxynitride semiconductor.

FIG. 7 shows results of SIMS. A solid line 601 represents the nitrogen concentration of the sample on which the heat treatment or the like was not performed (as-depo); a solid line 611, the nitrogen concentration of the sample after the heat treatment at 450° C.; and a solid line 621, the nitrogen concentration of the sample after the heat treatment at 650° C. Note that ranges indicated by double-headed arrows respectively denote the oxynitride semiconductor film 651 and the oxide semiconductor film 652.

From a comparison between the sample of as-depo and the sample after the heat treatment at 450° C., it is found that the heat treatment at 450° C. hardly causes diffusion of nitrogen from the oxynitride semiconductor film 651 into the oxide semiconductor film 652. On the other hand, from a comparison between the sample of as-depo and the sample after the heat treatment at 650° C., it is found that the heat treatment at 650° C. causes slight diffusion of nitrogen from the oxynitride semiconductor film 651 into the oxide semiconductor film 652.

According to this example, it was found that nitrogen hardly diffuses from an oxynitride semiconductor into an oxide semiconductor in a process at 450° C. or lower and nitrogen slightly diffuses at 650° C.

In other words, an oxynitride semiconductor is extremely stable, and diffusion of nitrogen due to heat treatment or the like is less likely to occur.

This application is based on Japanese Patent Application serial no. 2010-252489 filed with the Japan Patent Office on Nov. 11, 2010, the entire contents of which are hereby incorporated by reference.

What is claimed is:

1. A semiconductor device comprising:
    an oxide semiconductor layer comprising a first region, a second region, and a third region between the first region and the second region;
    a gate insulating film in contact with the oxide semiconductor layer;
    a gate electrode overlapping with the oxide semiconductor layer; and
    an insulating film in contact with top surfaces of the first region and the second region and a top surface and a side surface of the gate insulating film,
    wherein each of the first region and the second region is an oxynitride semiconductor region while the third region is an oxide semiconductor region, and
    wherein the first region and the second region comprise nitrogen while the third region does not comprise nitrogen.

2. The semiconductor device according to claim 1, wherein the first region and the second region serve as a source region and a drain region of a transistor, respectively.

3. The semiconductor device according to claim 1, wherein each of the first region, the second region, and the third region comprises In, Ga, and Zn.

4. A semiconductor device comprising:
    an oxide semiconductor layer comprising a first region, a second region, and a third region between the first region and the second region;
    a gate insulating film in contact with the oxide semiconductor layer;
    a gate electrode overlapping with the oxide semiconductor layer; and
    an insulating film in contact with top surfaces of the first region and the second region and a top surface and a side surface of the gate insulating film,
    wherein each of the first region and the second region is an oxynitride semiconductor region while the third region is an oxide semiconductor region,
    wherein the first region and the second region comprise nitrogen while the third region does not comprise nitrogen, and
    wherein the first region and the second region further comprise hydrogen.

5. The semiconductor device according to claim 4, wherein the first region and the second region serve as a source region and a drain region of a transistor, respectively.

6. The semiconductor device according to claim 4, wherein each of the first region, the second region, and the third region comprises In, Ga, and Zn.

* * * * *